United States Patent
Tyler et al.

(10) Patent No.: US 10,219,388 B2
(45) Date of Patent: Feb. 26, 2019

(54) METHODS OF TRANSFERRING ELECTRICALLY CONDUCTIVE MATERIALS

(71) Applicants: PPG Industries Ohio, Inc., Cleveland, OH (US); Si-Cal Technologies, Inc., Westborough, MA (US)

(72) Inventors: Jaye Tyler, Providence, RI (US); Paul F. Cheetham, Wexford, PA (US); Darren Burn, Enfield, CT (US); Gregory J. McCollum, Gibsonia, PA (US)

(73) Assignee: PPG Industries Ohio, Inc., Cleveland, OH (US)

(*) Notice: Subject to any disclaimer, the term of this patent is extended or adjusted under 35 U.S.C. 154(b) by 0 days.

(21) Appl. No.: 15/033,567

(22) PCT Filed: Oct. 31, 2014

(86) PCT No.: PCT/US2014/063406
§ 371 (c)(1),
(2) Date: Apr. 29, 2016

(87) PCT Pub. No.: WO2015/066462
PCT Pub. Date: May 7, 2015

(65) Prior Publication Data
US 2016/0286662 A1    Sep. 29, 2016

Related U.S. Application Data

(60) Provisional application No. 61/898,671, filed on Nov. 1, 2013.

(51) Int. Cl.
| | |
|---|---|
| *B32B 7/06* | (2006.01) |
| *B44C 1/24* | (2006.01) |
| *B44C 3/02* | (2006.01) |
| *H05K 1/09* | (2006.01) |
| *H05K 1/16* | (2006.01) |
| *H05K 3/00* | (2006.01) |
| *H05K 3/20* | (2006.01) |
| *H05K 3/38* | (2006.01) |
| *H05K 3/46* | (2006.01) |
| *B32B 37/00* | (2006.01) |
| *B32B 37/26* | (2006.01) |
| *B32B 38/10* | (2006.01) |
| *H01L 21/683* | (2006.01) |

(52) U.S. Cl.
CPC ......... *H05K 3/207* (2013.01); *H01L 21/6835* (2013.01); *H05K 3/007* (2013.01); *H05K 3/0017* (2013.01); *H05K 3/38* (2013.01); *H05K 3/4611* (2013.01); *B32B 7/06* (2013.01); *B32B 37/025* (2013.01); *B32B 38/10* (2013.01); *B32B 2037/268* (2013.01); *B44C 1/24* (2013.01); *B44C 3/02* (2013.01); *H05K 1/095* (2013.01); *H05K 1/16* (2013.01); *H05K 3/386* (2013.01); *H05K 2201/09018* (2013.01); *H05K 2201/0999* (2013.01); *H05K 2203/0156* (2013.01); *H05K 2203/1545* (2013.01)

(58) Field of Classification Search
CPC ............... H05K 1/095; H05K 1/16; H05K 2201/09018; H05K 2201/0999; H05K 2203/0156; H05K 2203/1545; H05K 3/0017; H05K 3/007; H05K 3/207; H05K 3/38; H05K 3/386; H05K 3/4611; H05K 2203/068; B32B 37/025; B32B 7/06; B32B 38/10; B32B 2037/268; B44C 3/02; B44C 1/24; H01L 21/6835
USPC .............. 156/235, 239, 240, 249, 289
See application file for complete search history.

(56) References Cited

U.S. PATENT DOCUMENTS

| | | | |
|---|---|---|---|
| 3,444,732 A * | 5/1969 | McKinley | ............... B29C 65/18 |
| | | | 156/378 |
| 3,703,603 A | 11/1972 | Levesoue et al. | |
| 4,775,439 A | 10/1988 | Seeger, Jr. et al. | |
| 5,045,141 A | 9/1991 | Salensky et al. | |
| 5,566,441 A | 10/1996 | Marsh et al. | |
| 6,136,127 A | 10/2000 | De Bastiani | |
| 6,262,692 B1 | 7/2001 | Babb | |
| 6,280,552 B1 | 8/2001 | Bottari | |
| 6,459,588 B1 | 10/2002 | Morizumi et al. | |
| 6,809,045 B1 | 10/2004 | Alam et al. | |

(Continued)

FOREIGN PATENT DOCUMENTS

| | | | |
|---|---|---|---|
| CN | 102458053 A | 5/2012 | |
| JP | 562435 B2 | 1/1981 | |

(Continued)

OTHER PUBLICATIONS

Translaion of JP2004247572.*

(Continued)

*Primary Examiner* — Sonya M Sengupta

(74) *Attorney, Agent, or Firm* — Michael J. Grese

(57) ABSTRACT

Methods of transferring an electrically conductive material to a substrate are disclosed. The methods include: a) contacting at least a portion of the substrate with an electrically conductive material disposed on a carrier film; and b) applying heat and pressure to the substrate and carrier film for a period of time ranging from 1 to 40 seconds, at a temperature ranging from 200° F. to 450° F., and at a pressure ranging from 30 to 150 psi, such that the electrically conductive material adheres to the substrate. Methods of forming a layered structure are also disclosed.

24 Claims, No Drawings

(56) References Cited

U.S. PATENT DOCUMENTS

| | | |
|---|---|---|
| 2006/0290512 A1 | 12/2006 | Shanton |
| 2007/0178232 A1 | 8/2007 | Kodas et al. |
| 2009/0143118 A1 | 6/2009 | Bae |
| 2009/0289856 A1 | 11/2009 | Cho et al. |
| 2014/0338192 A1* | 11/2014 | Chung .................. H05K 3/007 29/846 |
| 2017/0231098 A1* | 8/2017 | Zluc ...................... H05K 3/305 |

FOREIGN PATENT DOCUMENTS

| | | | |
|---|---|---|---|
| JP | 62200790 | A | 9/1987 |
| JP | 541463 | A | 2/1993 |
| JP | 7251045 | A | 10/1995 |
| JP | 2003331648 | A | 11/2003 |
| JP | 2004247572 | A | 9/2004 |
| JP | 2005277394 | A | 10/2005 |
| JP | 2006108129 | A | 4/2006 |
| JP | 2006254071 | A | 9/2006 |
| JP | 2010135692 | A | 6/2010 |
| JP | 2012509965 | A | 4/2012 |
| KR | 1020090069908 | A | 7/2009 |
| WO | 0039883 | A1 | 7/2000 |
| WO | 0042569 | A1 | 7/2000 |
| WO | 2006106982 | A1 | 9/2008 |
| WO | 2009025762 | A1 | 2/2009 |
| WO | 2011156677 | A1 | 12/2011 |

OTHER PUBLICATIONS

Translation of JP2003331648.*
Translation of JP2005277394.*
Translation of JP2006108129.*
Translation of JP2006254071.*
English translation of JP201035692.*
English translation of JPH0541463.*
English translation of JP2012509965.*
English translation of JPS62200790.*
English translation of JPH07251045.*
English translation of WO2006106982.*
Ethertronics: Product Information Page, Jan. 27, 2008, http://www.ethertronics.com/products/cellular/.
Ishinabe et al., "Finite Element Analysis of Mechanical Behavior and Thermal Shrinkage of Poly(Ethylene-Terephthalate) (PET) Film in the Glass Transition Temperature Region", The Japan Society of Mechanical Engineers, 2012, vol. 78:285, pp. 81-94. (English-language Abstract).

* cited by examiner

METHODS OF TRANSFERRING ELECTRICALLY CONDUCTIVE MATERIALS

CROSS REFERENCE TO RELATED APPLICATIONS

This application claims the benefit of U.S. Provisional Application No. 61/898,671 filed Nov. 1, 2013, which is hereby incorporated in its entirety by reference.

FIELD OF THE INVENTION

The present invention relates to methods of forming a layered structure with electrically conductive material, methods of transferring electronically conductive material, and devices with electronically conductive materials formed by such methods.

BACKGROUND OF THE INVENTION

Circuits, antennas, and other electrical elements are important components of consumer electronics. Currently, these electrical components are constructed on various types of substrates using, for example, laser direct structuring (LDS) and pad printing. LDS uses a laser beam to etch a pattern such as a circuit or antenna pattern into a thermoplastic material that is doped with an organic metal additive. A microscopically rough track is formed where the laser beam hits the doped thermoplastic material. The etched thermoplastic material is then subjected to a copper bath followed by metal plating. LDS is very time consuming and costly.

In pad printing, a pattern is etched into a plate that is subsequently filled with electrically conductive material. A pad is then placed onto the plate with enough pressure to transfer electrically conductive material to the pad. Finally, the pad is pressed onto a substrate transferring the electrically conductive material to the substrate in the shape of the etched pattern. This process is repeated several times to transfer a sufficient amount of electrically conductive material onto the substrate.

Thermal transferring techniques also have been used to make electrically conductive materials. However, these methods require multiple steps, long dwell times, high temperatures, and high pressures to transfer electrically conductive material. In addition, these methods commonly use environmentally undesirable materials such as halogenated organic compounds.

It is therefore desirable to provide a fast, consistent, cost-effective, and/or environmentally friendly method for transferring electrically conductive materials to substrates, and particularly, substrates used with wireless communication devices.

SUMMARY OF THE INVENTION

The present invention is directed to a method of transferring an electrically conductive material to a substrate. The method includes: a) contacting at least a portion of the substrate with an electrically conductive material disposed on a carrier film; and b) applying heat and pressure to the substrate and carrier film for a period of time ranging from 1 to 40 seconds, at a temperature ranging from 200° F. to 450° F., and at a pressure ranging from 30 to 150 psi, such that the electrically conductive material adheres to the substrate.

The present invention is also directed to a method of forming a layered structure for a heat stamping application including: a) applying a release coat to at least a portion of a carrier film; b) applying electrically conductive material in a pattern to the carrier film after application of the release coat, wherein the electrically conductive material is applied on top of at least a portion of the release coat; c) drying the electrically conductive material for a period of time ranging from 1 to 180 seconds; d) applying a dielectric material over at least a portion of the electrically conductive material, the release coat, or both; e) drying the dielectric material for a period of time ranging from 1 to 120 seconds; f) applying an adhesive over at least a portion of one or more of the dielectric material, the electrically conductive material, and the release coat; and g) drying the adhesive for a period of time ranging from 1 to 120 seconds.

The present invention is further directed to a method of transferring an electrically conductive material to a substrate. The method includes: a) forming a layered structure; b) contacting at least a portion of the substrate with the layered structure; and c) applying heat and pressure to the substrate and layered structure for a period of time ranging from 1 to 40 seconds, at a temperature ranging from 200° F. to 450° F., and at a pressure ranging from 30 to 150 psi, such that electrically conductive material adheres to the substrate. Step a) of forming the layered structure includes: 1) applying a release coat to at least a portion of a carrier film; 2) applying electrically conductive material in a pattern to the carrier film after application of the release coat, wherein the electrically conductive material is applied on top of at least a portion of the release coat; 3) drying the electrically conductive material; 4) applying an adhesive over at least a portion of the electrically conductive material, release coat, or both; and 5) drying the adhesive. Further, resistivity of the electrically conductive material can decrease and conductivity of the electrically conductive material can increase after applying heat and pressure.

DESCRIPTION OF THE INVENTION

In accordance with the present invention, a method of transferring electrically conductive material to a substrate can include contacting at least a portion of the substrate with the electrically conductive material disposed on a carrier film, and applying heat and pressure such that the electrically conductive material adheres to the substrate. The electrically conductive material transferred to the substrate can be any material that is capable of conducting an electrical current, as determined with a multimeter. According to the present invention, the electrically conductive material includes electroconductive metal particles. Non-limiting examples of suitable electroconductive metal particles include particles of nickel, iron, copper, zinc, chromium, cobalt, aluminum, silver, gold, iridium, platinum, palladium, zirconium, tin, and mixtures thereof. The electroconductive metal particles also can include particles of alloys of at least two of such metals which exhibit electroconductivity. The electroconductive metal particles can also include particles of alloys of at least two metals where at least one exhibits electroconductivity and at least one does not. The metal particles can include, but are not limited to, powders, fibers, flakes, or combinations thereof. The electrically conductive material may also comprise one or more metal salts, metal oxides, metal colloids, and/or other metal complexes. The electrically conductive material can also include carbon.

In addition to electroconductive metal particles, the electrically conductive material may also include a binder. The binder can be thermoplastic or cross-linkable such as a thermoset binder. The term "thermoplastic" refers to polymers which are capable of reversibly softening or fusing when heated and hardening when cooled. The term "thermoset" refers to a polymer cross-linked from heat, actinic radiation, and the like. As used herein, the term "actinic radiation" refers to electromagnetic radiation that can initiate chemical reactions. Actinic radiation includes, but is not limited to, visible light, ultraviolet (UV), X-ray, and gamma radiation. Further, as used herein, the term "polymer" refers to prepolymers, oligomers and both homopolymers and copolymers. The term "resin" is used interchangeably with "polymer".

Non-limiting examples of binders include binders made with polyimides, vinyl polymers, polystyrenes, acrylic polymers such as poly(methyl (meth)acrylate), poly(butyl (meth) acrylate), and poly(butyl acrylate), urethanes, polyesters, polyethers, polyvinyl chloride, cellulosic binders including binders containing nitrocellulose, and mixtures thereof.

The electrically conductive material also may include additional components including, but not limited to, curing agents, dispersion agents, flow control additives, thickening agents, plasticizers, colorants, and solvents. The term "colorant" refers to any substance that imparts color and/or other opacity and/or other visual effects to the composition. Non-limiting examples of colorants include pigments, dyes, and tints, as well as, special effect compositions. The solvents may include water, organic solvents, and mixtures thereof.

The substrate can be any substrate known in the art. The substrate can be planar or non-planar. As used herein, the term "planar substrate" refers to a substrate which extends primarily in two dimensions, while the term "non-planar substrate" refers to a substrate that does not lie essentially in a two dimensional plane and can extend, for example, in a three dimensional orientation. For example, the substrate can include a three dimensional curved or angled (non-planar) housing of a mobile phone, game console, DVD player, computer, wireless modem, and the like. The substrate used with the present invention can be a planar and/or non-planar preformed molded plastic housing. The substrate also can be made from a variety of materials. Non-limiting examples of substrates include substrates made of acrylonitrile butadiene styrene (ABS), styrene acrylonitrile (SAN), polystyrene, polypropylene, high-density polyethylene (HDPE), low-density polyethylene (LDPE), polyamides, polysulfones, phenolic polymers, acrylics, vinyl polymers, glass, wood, urethanes, epoxies, polyesters, and mixtures thereof. The process of the present invention may be particularly suitable for materials with low glass transition temperatures. For example, the substrate used with the present process can have a glass transition temperature of less than 150° C., less than 130° C., less than 120° C., less than 110° C., less than 100° C., or less than 90° C., such as determined by differential scanning calorimetry.

As indicated, the method of transferring an electrically conductive material to a substrate may include contacting at least a portion of a substrate with electrically conductive material that is disposed on a carrier film. The carrier film may be made of any material that can withstand heat and pressure such that its function with the present methods is retained. For example, the carrier film used with the present methods may withstand heat applied during a hot stamping process such that the carrier film can transfer electrically conductive material to a substrate during the hot stamping process. The carrier film also may be flexible, allowing it to be contacted with substrates of varying dimensions and shapes. Non-limiting examples of suitable carrier films are films produced from polyethylene, polyethylene terephthalate (PET), polypropylene, polyesters, polyimides, polycarbonates, paper, impregnated paper, silicones, fluoropolymers, and copolymers and mixtures thereof. An example of a polyimide film that may be used as the carrier film is sold under the trade-name KAPTON®, which is commercially available from DuPont.

The electrically conductive material may be disposed over at least a portion of the carrier film in a pattern or design that, when adhered to a substrate, can be electrically connected to an electronic device by way of a conductive adhesive, electrically conductive pads, pogo-pins, vias or other methods, thus allowing an electrical current or signal to be transmitted to the electronic device. For instance, the electrically conductive material may be disposed over at least a portion of the carrier film in a pattern that forms a circuit or antenna. The electrically conductive material may be also disposed over at least a portion of the carrier film for the formation of piezo coils, electroluminescent, ground plane, and/or EMI/RFI shielding. When coupled to a pogo-pin, for example, an electrical connection can be made so that an electrical current or signal to be transmitted can be received or transmitted by the device. The electrically conductive material may be disposed, such as in a pattern, using various printing methods. Non-limiting examples of printing methods that can be used to apply the electrically conductive materials to the carrier film include digital printing, flexographic printing, gravure printing, screen printing, and the like. The electrically conductive material also may be applied using various other methods that are known in the art.

One or more additional materials may also be deposited on the carrier film. These additional materials can be disposed over the electrically conductive material, under the electrically conductive material, or both. Further, when one or more additional materials are applied, the additional materials may be applied in various orders. The additional material or materials can also be selectively disposed in a pattern over top of the carrier film, the electrically conductive material, and/or each other. Any combination of materials is encompassed within the scope of the present invention. As used herein, when one material is described as being deposited or applied over another. It is meant that there is no other material there between, unless specifically indicated.

For example, a release coat may be applied over at least a portion of the carrier film in certain patterns or it may form a substantially continuous layer over the surface of the carrier film. The release coat may be thermoplastic. Alternatively, the release coat may be cured through heat, actinic radiation, electron beams (EB), and the like. Non-limiting examples of suitable release coats include coatings made with acrylic polymers, cured silicones, fluoropolymers, and mixtures thereof. The surface or surfaces of the release coat may be glossy, matte, or textured depending on aesthetic requirements. The release coat helps separate the carrier film from the electrically conductive material and/or one or more additional materials. Accordingly, the release coat is typically applied directly to the carrier film, although the invention is not so limited.

When a release coat is used, a dielectric material may be applied over at least a portion of the release coat. Alternatively, if a release coat is not used, the dielectric material may be applied directly over the carrier film. The dielectric material can be applied in any desired pattern. The dielectric material may be applied using various printing methods. Non-limiting examples of printing methods that can be used to apply the dielectric material include digital printing, flexographic printing, gravure printing, screen printing, and the like. The dielectric material may be applied using various other methods that are known in the art. The dielectric material can be any material, such as a polymer, that functions as an electrical insulator or which can assist in sustaining an electric field with a minimum dissipation of power. The dielectric can be thermoplastic. Alternatively, the dielectric material is cured through heat, actinic radiation, or electron beams (EB). Non-limiting examples of dielectric materials that are suitable for use with the present invention include acrylic polymers, polyimides, polyethylene, polypropylene, polysulfones, epoxies, rubbers, and mixtures thereof.

When a release coat and dielectric material are applied to the carrier film before the electrically conductive material, the electrically conductive material may be applied on top of at least a portion of the dielectric material, on top of at least a portion of the release coat, or both. The dielectric material can also be applied over at least a portion of the carrier film. Alternatively, when the dielectric material is applied on top of and/or adjacent to the electrically conductive material, the dielectric material can electrically insulate the electrically conductive material and protect it from damage or unintentional electrical contact.

An adhesive may be applied over at least a portion of one or more of the electrically conductive material, dielectric material, and release coat. The adhesive can applied in substantially the same pattern as the electrically conductive material. In this manner, adhesion of the electrically conductive material to the substrate may be enhanced. The adhesive can be applied using various methods including, but not limited to, digital printing, flexographic printing, gravure printing, screen printing, and the like. Types of adhesives that can be used will depend upon the substrate that will be receiving the electrically conductive material. Non-limiting examples of adhesives include acrylic polymers, epoxies, polyimides, polyurethanes, polyesters, and mixtures thereof.

Other materials in addition to any or all of those described above also may be used with the carrier film. Such materials include decorative and functional materials that can be used for identification purposes, product labeling, security purposes, protective purposes, and the like. For example, the decorative and functional materials can be used to exhibit color and/or graphic logos, display operating instructions, contain bar codes, and the like. The decorative and functional materials can be applied, such as in a pattern, over at least a portion of one or more of the release coat, dielectric material, electrically conductive material, and/or adhesive.

It should be understood that the materials described herein can be deposited or applied in any order. For instance, the electrically conductive material, release coat, dielectric material, adhesive, decorative materials, and functional materials can be deposited or applied to the carrier film in any desired order. Further, each material described herein can be deposited or applied on top of and/or adjacent to one or more of the other materials.

Some or all of the materials described herein including, but not limited to, the electrically conductive material, carrier film, release coat, dielectric material, adhesive, decorative materials, and/or functional materials may be substantially free, may be essentially free, and may be completely free of halogenated organic compounds. As used herein, the term "halogen" refers to the halogen elements, which include fluorine, chlorine, bromine and iodine, and the term "halogenated organic compounds" refers to organic compounds comprising halogen groups such as a fluoro, chloro, bromo and/or iodo groups. Further, the term "substantially free," as used in this context, means the electrically conductive material contains less than 1000 parts per million (ppm), "essentially free" means less than 100 ppm, and "completely free" means less than 20 parts per billion (ppb) of a halogenated organic compound. In addition, the electrically conductive material may be substantially free, may be essentially free, and may be completely free of silver-silver chloride.

Each of the materials described above, including the electrically conductive material, can be applied as a wet-on-wet process. Alternatively, each of the materials described above, including the electrically conductive material, can be subjected to a drying step after being deposited. As used herein, the "drying" step refers to the period of time that each material or combination of materials is subjected to an external drying source such as, but not limited to, heat, actinic radiation, electron beam, and the like. The drying steps can help form and, in some instances, cure the various materials after deposition. The drying steps also can remove some or all of the solvent that may be present. Such solvents include water, organic solvents, and mixtures thereof.

Each material can be subjected to the drying step for a maximum period of time of 180 seconds, 150 seconds, 120 seconds, 110 seconds, 100 seconds, 90 seconds, 50 seconds, or 10 seconds. Each material can be subjected to the drying step for a minimum period of time of 1 second, 20 seconds or 60 seconds. As such, each material can be subjected to the drying step for a period of time ranging from 1 to 180 seconds, or from 1 to 150 seconds, or from 1 to 120 seconds, or from 1 to 110 seconds, or from 1 to 100 seconds, or from 1 to 90 seconds. Each material can be subjected to the drying step for a period of time ranging from 60 to 90 seconds. Further, each material can be subjected to a drying step ranging from 1 to 10 seconds. The short drying times of the present invention allow each material to be disposed onto the carrier film at a fast rate, thereby allowing the present methods to occur at speeds that are greatly reduced when compared to other methods. The fast drying times also allow for quick solvent removal, which prevents subsequent interlayer separation problems during the hot stamp transferring process. For instance, the fast drying times help prevent the surface of each from attaining a glass like state or structure, which often results in inter-cohesion failure between the layers of material. As such, the fast drying times can improve the binding between two layers.

The drying step can include heating each material after its application. The temperature for heating each material will depend on the chemical and physical properties of the material. In accordance with the present invention, each material can be subjected to heat with a maximum temperature of 400° F., 350° F., 300° F., or 270° F. Each material can also be subjected to heat with a minimum temperature of 100° F., 120° F., 150° F., or 180° F. Further, each material can be subjected to heat at a temperature ranging from 100° F. to 350° F. or from 180° F. to 270° F.

When the materials are produced from actinic radiation curable or electron beam curable components, the materials may be exposed to actinic radiation or electron beams after deposition. The materials also may be subjected to additional treatment steps to achieve other desired properties such as, but not limited to, calendaring.

Some or all of the materials described above can be applied as a wet-on-wet process and then subjected to a single drying step. For example, a release coat can be applied over a carrier film, electrically conductive material can be applied over at least a portion of the release coat, an adhesive can be applied over at least a portion of the electrically conductive material, release coat, or both, and then the electrically conductive material and adhesive can be dried together such as for 1 to 180 seconds, from 1 to 150 seconds, 1 to 120 seconds, 1 to 90 seconds, or any of the other drying times previously described.

After exposing the materials to an external source to promote drying, the dried material or materials can be exposed to ambient conditions before additional materials are applied. During this period of time, residual solvent still present after the drying step may continue to dissipate from the material or materials.

In accordance with the present invention, the electrically conductive material, release coat, dielectric material, adhesive, and/or other decorative and functional materials can be applied to the carrier film to form a layered structure. Accordingly, the present invention is further directed to a method of making a layered structure comprising: 1) applying a release coat to at least a portion of a carrier film; 2) applying electrically conductive material in a pattern to the carrier film after application of the release coat, wherein the electrically conductive material is applied on top of at least a portion of the release coat; 3) drying the electrically conductive material; 4) applying an adhesive over at least a portion of one or more of the electrically conductive material, release coat, or both; and 5) drying the adhesive. The electrically conductive material and adhesive may be dried after being applied such from 1 to 180 seconds, from 1 to 150 second, 1 to 120 seconds, 1 to 90 seconds, or any of the other drying times previously described. In addition, the layered structure can also include dielectric, decorative and/or functional materials applied over at least a portion of one or more of the release coat, electrically conductive material, adhesive, and carrier film. For example, a dielectric material and/or a decorative material can be applied on top of at least a portion of the release coat and/or the electrically conductive material. The dielectric, decorative, and functional materials may be applied in any desired pattern. The dielectric, decorative and functional materials may be dried independently or together (optionally with the other materials) after being applied, such as from 1 to 180 seconds, from 1 to 150 second, 1 to 120 seconds, 1 to 90 seconds, or any of the other drying times previously described.

The layered structure can be rolled for storage and/or shipping. For example, a layered structure can be formed by separately applying and optionally drying one or more of a release coat, electrically conductive material, adhesive, dielectric material, and decorative material onto a carrier film, and then the layered structure is coiled or recoiled into a roll. Accordingly, it may be desired that at least the outermost surface of the materials applied to the carrier film are tack free. The rolled tack free layered structure can later be unrolled and used in a heat stamping process to transfer electrically conductive materials to a substrate. By "tack free", it is meant that the layered structure is dried to the touch and adheres to the substrate when tested according to ASTM D3359-09 (editorial version 2), test method B.

After applying the electrically conductive material (and optionally, other additional materials) onto the carrier film, the carrier film is contacted with a substrate. The substrate can be secured in place to prevent the substrate from moving and then the carrier film is contacted with the substrate. Heat and pressure are then applied to the substrate and carrier film, which includes the electrically conductive material and optionally any of the other materials described herein. For example, a layered structure may be contacted with a substrate that is secured in place or fixtured. Heat and pressure may then be applied to the layered structure and substrate. Heat and pressure can be applied with a hot stamping press, such as a rubber wheel hot stamping press.

Heat and pressure are applied such that the electrically conductive material adheres to the substrate. One or more of an adhesive, dielectric material, release coat, and decorative material used with the carrier film can also be adhered to the substrate after applying heat and pressure. For example, an adhesive, dielectric material, and electrically conductive material can be adhered to the substrate after applying heat and pressure.

Heat and pressure are applied by hot stamping (also known as heat stamping) the carrier film, which includes the electrically conductive material and, optionally, any of the other materials described above (such as, the layered structure), with the substrate. Heat can be applied to the carrier film (or layered structure) and substrate at a maximum temperature of 450° F., 420° F., 400° F., or 380° F. Heat can also be applied to the carrier film (or layered structure) and substrate at a minimum temperature of 200° F., 250° F., 300° F., 320° F., 340° F., or 350° F. Further, heat can be applied to the carrier film (or layered structure) and substrate at a temperature ranging from 200° F. to 450° F., or from 300° F. to 450° F., or from 320° F. to 420° F., or from 340° F. to 400° F. Heat can also be applied to the carrier film (or layered structure) and substrate at a temperature ranging from 350° F. to 380° F.

The carrier film (or layered structure) and substrate can be pressed together at a maximum pressure of 180 psi, 150 psi, 120 psi, 100 psi, or 80 psi. The carrier film (or layered structure) and substrate can be pressed together at a minimum pressure of 30 psi, 40 psi, 50 psi, or 60 psi. The carrier film (or layered structure) and substrate can be pressed together at a pressure ranging from 30 to 150 psi, such as from 40 to 120 psi, or from 50 to 100 psi. Further, the carrier film (or layered structure) and substrate can be pressed together at a pressure ranging from 60 to 80 psi.

Heat and pressure can be applied at a maximum time period of 60 seconds, 50 seconds, 40 seconds, 30 seconds, 20 seconds, 10 seconds, 5 seconds, or 3 seconds. Heat and pressure can also be applied at a minimum time period of 1 second, 3 seconds, or 5 seconds. Further, heat and pressure can be applied for 1 to 40 seconds, such as from 1 to 30 seconds, such as from 1 to 20 seconds, or from 1 to 10 seconds. In addition, heat and pressure can be applied from 1 to 5 seconds or from 1 to 3 seconds.

Transferring electrically conductive materials at such short time periods helps increase the production rate of electronic devices such as mobile phones. In addition, the low heat and pressure applied during the transferring process makes it possible to transfer electrically conductive materials to preformed molded plastic housings that may deform, melt, and/or warp at high temperatures and/or pressures.

The resistivity of the electrically conductive material adhered to the substrate may be less than 20 milliohm per square per mil, such as less than 15 milliohm per square per mil. Further, the electrically conductive material adhered to the substrate can have a resistivity of less than 10 milliohm per square per mil. Resistivity can be determined using various techniques known in the art. The resistivity described above was determined by measuring various areas on the electrically conductive material with a multimeter, such as a Fluke 189 Multimeter. The resistance obtained from the multimeter is then taken over a square unit (for example, the square unit of the conductive pattern) and then normalized to film height of 1 mil (dry film thickness) to obtain the resistivity per square per mil. This is referred to herein as the "resistivity measurement." Further, as understood by those skilled in the art, the resistance of a material is inversely related to the conductance of the material. Thus, as the resistance of the electrically conductive material decreases, the conductance of the electrically conductive material increases.

After being adhered to the substrate, the electrically conductive material can have a maximum dry film thickness of 50 microns, 40 microns, 30 microns, 20 microns, 10 microns, or 4 microns. After being adhered to the substrate, the electrically conductive material can have a minimum dry film thickness of 1 micron, 10 microns, or 20 microns. Further, after being adhered to the substrate, the electrically conductive material can have a dry film thickness ranging from 1 to 50 microns, such as from 10 to 40 microns, such as from 20 to 40 microns, or from 20 to 30 microns. In addition, after being adhered to the substrate, the electrically conductive material can have a dry film thickness ranging from 1 to 10 microns or from 1 to 4 microns.

It was found that the resistivity/conductivity values and dry film thicknesses of the electrically conductive materials can be consistently reproduced using a single application of heat and pressure according to the present invention. The remarkable reproducibility obtained by the present methods minimizes if not eliminates variations that can lead to significant scrapping or discarding of substrates with electrically conductive materials that deviate or vary too far from product specifications or requirements.

In accordance with the present invention, the resistance/resistivity of the electrically conductive material is typically decreased after applying heat and pressure, thereby improving the conductive/conductivity of the electrically conductive material adhered to the substrate. Accordingly, the resistance/resistivity of the electrically conductive material can be reduced and the conductive/conductivity of the electrically conductive material can be improved after applying heat and pressure according to the present invention. For example, after applying heat and pressure according to the present invention, resistance/resistivity of the electrically conductive material can be decreased and conductive/conductivity of the electrically conductive material can be increased by at least 1%, at least 5%, at least 10%, at least 15%, at least 20%, at least 25%, or at least 30%.

Optionally, after applying heat and pressure, the carrier film can be removed leaving the electrically conductive material adhered to the substrate. The carrier film is easily and quickly removed by peeling the film away from the substrate.

When the carrier film includes an adhesive, dielectric material, electrically conductive material, and release coat, the carrier film can be removed leaving the electrically conductive material and one or more of the adhesive, dielectric material, and release coat adhered to the substrate. The adhesive, dielectric material, electrically conductive material, and release coat can all be left adhered to the substrate after removing the carrier film. Alternatively, the release coat can be removed with the carrier film leaving only the adhesive, dielectric material, and electrically conductive material adhered to the substrate. When a decorative material is used, the decorative material can also be left adhered to the substrate after removing the carrier film.

The electrically conductive material can be adhered in a pattern onto the substrate and connected to an electronic device by way of conductive adhesives, electrically conductive pads, pogo-pins, vias or other methods, thus allowing an electrical current or signal to be transmitted to the electronic device. For instance, the electrically conductive material can form a circuit or antenna on the substrate where it is connected to an electronic device. Accordingly, substrates with electrically conductive materials formed in such patterns may be used in wireless communication devices. As such, the methods described herein may be used to form an antenna or multiple antennas on a substrate for a mobile phone. The antenna or antennas may be formed on the inside and/or the outside of the housing or cover of the mobile phone.

In addition, by using the methods described herein, the electrically conductive material can be transferred to both planar and non-planar substrates such as 3-dimensional shaped substrates. Accordingly, the substrates used with the methods of transferring electrically conductive material described herein are not limited to substrates of any particular shape or size.

The present invention further includes the subject matter of the following clauses.

Clause 1: A method of transferring an electrically conductive material to a substrate, the method including: a) contacting at least a portion of the substrate with the electrically conductive material disposed on a carrier film; and b) applying heat and pressure to the substrate and carrier film for a period of time ranging from 1 to 40 seconds, at a temperature ranging from 200° F. to 450° F., and at a pressure ranging from 30 to 150 psi, such that the electrically conductive material adheres to the substrate.

Clause 2: The method of clause 1, further including c) removing the carrier film from the substrate after step b).

Clause 3: The method of any of clauses 1-2, wherein the electrically conductive material is applied in a pattern over at least a portion of the carrier film.

Clause 4: The method of any of clauses 1-3, wherein the carrier film further includes a release coat, a dielectric material and/or an adhesive, each of which may be applied over the electrically conductive material, under the electrically conductive material, or both.

Clause 5: The method of any of clauses 1-4, wherein a release coat is applied to at least a portion of the carrier film, and a dielectric material is applied to at least a portion of the release coat.

Clause 6: The method of any of clauses 1-4, wherein the electrically conductive material is applied to the carrier film after application of a dielectric material and a release coat, and the electrically conductive material is applied in a pattern on top of at least a portion of the dielectric material, on top of at least a portion of the release coat, or both.

Clause 7: The method of any of clauses 1-4, wherein the carrier film further comprises (i) an adhesive and (ii) a release coat and/or a dielectric material, and wherein the adhesive is applied over at least a portion of the release coat, the dielectric material, and/or the electrically conductive material.

Clause 8: The method of any of clauses 1-4, wherein the carrier film further comprises a release coat, an adhesive, and/or a dielectric material, and wherein a decorative material is applied over at least a portion of one or more of the electrically conductive material, the release coat, the adhesive, the dielectric material, and the carrier film.

Clause 9: The method of any of clauses 1-8, wherein one or more of the release coat, the dielectric material, the electrically conductive material, and the adhesive is completely free of halogenated organic compounds.

Clause 10: The method of any of clauses 1-9, wherein the electrically conductive material comprises electrically conductive particles comprising nickel, iron, copper, zinc, chromium, cobalt, aluminum, silver, gold, iridium, platinum, palladium, zirconium, tin, carbon, or mixtures thereof.

Clause 11: The method of any of clauses 1-10, wherein the electrically conductive material includes a binder.

Clause 12: The method of clause 11, wherein the binder is thermoplastic.

Clause 13: The method of any of clauses 1-12, wherein the electrically conductive material is completely free of silver-silver chloride.

Clause 14: The method of any of clauses 1-13, wherein the electrically conductive material forms an antenna on the substrate.

Clause 15: The method of any of clauses 1-14, wherein the substrate is non-planar.

Clause 16: The method of any of clauses 1-15, wherein the substrate has a glass transition temperature of less than 150° C.

Clause 17: The method of any of clauses 1-16, wherein the electrically conductive material adhered to the substrate has a resistivity of less than 20 milliohms per square per mil, as determined by the resistivity measurement.

Clause 18: The method of any of clauses 1-17, wherein conductivity of the electrically conductive material increases after applying heat and pressure.

Clause 19: The method of any of clauses 1-18, wherein heat and pressure are applied to the substrate and carrier film for a period of time ranging from 1 to 20 seconds, at a temperature ranging from 300° F. to 450° F., and at a pressure ranging from 40 to 120 psi, such that the electrically conductive material adheres to the substrate.

Clause 20: A mobile phone comprising an antennae prepared from the method according to any of clauses 1-19.

Clause 21: A method of forming a layered structure for a heat stamping application including: a) applying a release coat to at least a portion of a carrier film; b) applying electrically conductive material in a pattern to the carrier film after application of the release coat, wherein the electrically conductive material is applied on top of at least a portion of the release coat; c) drying the electrically conductive material for a period of time ranging from 1 to 180 seconds; d) applying a dielectric material over at least a portion of the electrically conductive material, the release coat, or both; e) drying the dielectric material for a period of time ranging from 1 to 120 seconds; f) applying an adhesive over at least a portion of one or more of the dielectric material, the electrically conductive material, and the release coat; and g) drying the adhesive for a period of time ranging from 1 to 120 seconds.

Clause 22: The method of clause 21, further including applying a decorative material over at least a portion of one or more of the carrier film, release coat, dielectric material and electrically conductive material, and drying the decorative material for a period of time ranging from 1 to 120 seconds.

Clause 23: The method of any of clauses 21-22, wherein the layered structure is rolled after step g).

Clause 24: A method of transferring an electrically conductive material to a substrate. The method can include a) forming a layered structure from a method comprising: i) applying a release coat to at least a portion of a carrier film; ii) applying electrically conductive material in a pattern to the carrier film after application of the release coat, wherein the electrically conductive material is applied on top of at least a portion of the release coat; iii) drying the electrically conductive material; iv) applying an adhesive over at least a portion of the electrically conductive material, release coat, or both; and v) drying the adhesive. The method can further include: b) contacting at least a portion of the substrate with the layered structure; and c) applying heat and pressure to the substrate and layered structure for a period of time ranging from 1 to 40 seconds, at a temperature ranging from 200° F. to 450° F., and at a pressure ranging from 30 to 150 psi, such that the electrically conductive material adheres to the substrate, wherein conductivity of the electrically conductive material increases after applying heat and pressure.

Clause 25: The method of clause 24, further comprising d) removing the carrier film from the substrate after step c).

Clause 26: The method of any of clauses 24-25, wherein the electrically conductive material adhered to the substrate has a resistivity of less than 20 milliohms per square per mil, as determined by the resistivity measurement.

Clause 27: The method of any of clauses 24-26, further including applying a dielectric material over at least a portion of one or more of the carrier film, release coat, and electrically conductive material, and then drying the dielectric material, wherein the electrically conductive material, adhesive, and dielectric material are dried for a period of time ranging from 1 to 180 seconds.

The present invention has been described with reference to specific details of particular features thereof. It is not intended that such details be regarded as limitations upon the scope of the invention except insofar as and to the extent that they are included in the accompanying claims.

Further, it is to be understood that the invention may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about". Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In addition, the use of the singular includes the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise. For example, "an" electrically conductive material, "a" carrier film, "a" release coat, "a" dielectric material, "an" adhesive, "a" decorative material, and "a" functional material means one or more of an electrically conductive material, one or more of a carrier film, one or more of a release coat, one or more of a dielectric material, one or more of an adhesive, one or more of a decorative material, and one or more of a functional material.

EXAMPLES

The following Examples are presented to demonstrate the change in resistivity and/or resistance in electrically conductive materials after applying heat and temperature at short time periods. The invention should not be considered as limited to the specific Examples presented.

Example 1

A silver based composition comprising silver flakes dispersed in a vinyl binder was spread over a 280 mesh screen coated with a Capillex CX emulsion (a green capillary photostencil film commercially available from MacDermid Autotype) and having a test pattern opening of a 4 by 4 square. The composition was pressed through the openings and onto 5 mil polyethylene terephthalate (PET) films using a 70 Durometer squeegee blade. The composition was then dried in an oven for 3 minutes at 266° F. (130° C.). The dried film thickness of the composition was between 3 and 4 microns, as determined by a Surfcom Surface Profilometer. Resistance was measured by placing two Fluke 189 Multimeter probes 3-4 cm apart on the patterned composition. The measuring points were marked for later reference.

A heated die was then pressed onto each PET film sample for 1-3 seconds at a pressure of about 80 psi. The die was heated to 300° F., 350° F., and 400° F. Two PET film samples were pressed at each temperature. Resistance of the silver based compositions was measured by placing two Fluke 189 Multimeter probes 3-4 cm apart on the previously marked points of the patterned composition. The resistivity of six samples of the silver based composition, before and after heat stamping, are listed in Tables 1-3. All samples were prepared of the same materials described above.

TABLE 1

| Resistivity (ohms ($\Omega$) per square per mil) | Sample 1 | Sample 2 |
|---|---|---|
| Initial Resistivity | 0.39 | 0.34 |
| Resistivity after heat stamping @ 300° F. | 0.36 | 0.32 |
| Change in Resistivity | −0.03 | −0.02 |
| Average Change in Resistivity | −0.025 | |

TABLE 2

| Resistivity (ohms ($\Omega$) per square per mil) | Sample 3 | Sample 4 |
|---|---|---|
| Initial Resistivity | 0.35 | 0.37 |
| Resistivity after heat stamping @ 350° F. | 0.37 | 0.34 |
| Change in Resistivity | +0.02 | −0.03 |
| Average Change in Resistivity | −0.005 | |

TABLE 3

| Resistivity (ohms ($\Omega$) per square per mil) | Sample 5 | Sample 6 |
|---|---|---|
| Initial Resistivity | 0.35 | 0.32 |
| Resistivity after heat stamping @ 400° F. | 0.27 | 0.29 |
| Change in Resistivity | −0.08 | −0.03 |
| Average Change in Resistivity | −0.055 | |

As shown in Tables 1-3, the resistivity of the silver based composition decreased in almost all samples after applying heat and pressure for 1-3 seconds. Accordingly, the conductivity of the silver based composition improved after applying heat and pressure according to the present methods.

Example 2

A silver based composition comprising silver flakes dispersed in a urethane binder was spread over a 280 mesh screen coated with a Capillex CX emulsion and having a test pattern opening of a 4 by 4 square. The composition was pressed through the openings and onto 5 mil polyethylene terephthalate (PET) films using a 70 Durometer squeegee blade. The composition was then dried in an oven for 3 minutes at 266° F. (130° C.). The dried film thickness of the composition was between 5 and 6 microns, as determined by a Surfcom Surface Profilometer. Resistance was measured by placing two Fluke 189 Multimeter probes 3-4 cm apart on the patterned composition. The measuring points were marked for later reference.

A heated die was then pressed onto each PET film sample for 1-3 seconds at a pressure of about 80 psi. The die was heated to 300° F., 350° F., and 400° F. Resistance of the silver based compositions was measured by placing two Fluke 189 Multimeter probes 3-4 cm apart on the previously marked points of the patterned composition. The resistivity of six samples of the silver based composition, before and after heat stamping, are listed in Tables 4-6. All six samples were prepared of the same materials described above.

TABLE 4

| Resistivity (ohms ($\Omega$) per square per mil) | Sample 7 | Sample 8 |
|---|---|---|
| Initial Resistivity of Dried Ink | 0.34 | 0.33 |
| Resistivity after heat stamping @ 300° F. | 0.31 | 0.35 |
| Change in Resistivity | −0.03 | +0.02 |
| Average Change in Resistivity | −0.005 | |

TABLE 5

| Resistivity (ohms ($\Omega$) per square per mil) | Sample 9 | Sample 10 |
|---|---|---|
| Initial Resistivity of Dried Ink | 0.33 | 0.31 |
| Resistivity after heat stamping @ 350° F. | 0.27 | 0.28 |
| Change in Resistivity | −0.06 | −0.03 |
| Average Change in Resistivity | −0.045 | |

TABLE 6

| Resistivity (ohms (Ω) per square per mil) | Sample 11 | Sample 12 |
|---|---|---|
| Initial Resistivity of Dried Ink | 0.35 | 0.35 |
| Resistivity after heat stamping @ 400° F. | 0.34 | 0.32 |
| Change in Resistivity | −0.01 | −0.03 |
| Average Change in Resistivity | −0.02 | |

As shown in Tables 4-6, and similar to the results obtained in Example 1, the resistivity of the silver based composition decreased in almost all samples after applying heat and pressure for 1-3 seconds. Accordingly, the conductivity of the silver based composition improved after applying heat and pressure according to the present methods.

As described above, the silver based compositions applied to the PET carrier films had a dried film thickness ranging between 3 and 6 microns. It is expected that the conductivity would increase even further in thicker films after applying heat and pressure according to the present methods.

Example 3

A silver based composition comprising silver flakes dispersed in a styrene butadiene binder was spread over a 230 mesh screen coated with a Capillex CX emulsion and having a six up ultra-high frequency (UHF) antenna test pattern opening with an approximate size of 5 by 5 inches. The ink based composition was pressed through the openings and onto 2 mil silicon (release coating) treated polyethylene terephthalate (PET) films using a 70 Durometer squeegee blade. The ink based composition was then dried in an oven for 3 minutes at 266° F. (130° C.). The dried film thickness of the silver based composition was between 6 and 8 microns, as determined by a Surfcom 130A Surface Profilometer. Resistance was measured by placing two Fluke 189 Multimeter probes across the UHF ring loop. The measuring points were marked for later reference.

Next, an adhesive composition was applied over the UHF antenna pattern with the use of a 165 stainless steel mesh screen having a thread diameter of 51 microns, an emulsion over mesh (EOM) of 5 microns and a test pattern opening of 6 by 6 inches. The adhesive composition was pressed through the stainless steel mesh with a 70 Durometer squeegee blade. The adhesive layer was left to rest for 30 seconds and then dried in an oven for 15 seconds at 120° C. (248° F.). The dried film thickness of the adhesive layer was between 30 and 35 microns, as determined by a Mitutoyo micrometer.

The PET film with the silver based UHF antenna pattern and adhesive layer were cut into strips and applied to a 2.8 mm acrylic substrate using an 80 Durometer rubber wheel hot stamping press with a roller temperature of 195° C. (383° F.) and a contact time of 2 seconds at a pressure of 60 psi. The PET film was then removed from the substrate. The resistance of the antennas transferred onto the acrylic substrates were measured by placing two Fluke 189 Multimeter probes across the UHF ring loop on the previously marked points. The resistance of two sample strips, before and after heat stamping to a 2.8 mm acrylic substrate, are listed in Table 7.

TABLE 7

| Resistance (ohms (Ω)) | Sample 13 | Sample 14 |
|---|---|---|
| Initial Resistance of dried silver antenna loop | 1.69 | 1.57 |
| Resistance after heat stamping @ 383° F. | 1.54 | 1.47 |
| Change in Resistance | −0.15 | −0.10 |
| Percent Decrease in Resistance (%) | 8.9% | 6.4% |
| Average Change in Resistance | −0.125 | |
| Average Percent Decrease in Resistance (%) | 7.7% | |

As shown in Table 7, the resistance of the silver based composition decreased in both samples after applying heat and pressure for 2 seconds. Accordingly, the conductivity of the silver based composition improved after applying heat and pressure according to the present methods.

Example 4

A silver based composition comprising silver flakes dispersed in a styrene butadiene binder was spread over a 230 mesh screen coated with a Capillex CX emulsion and having a six up ultra-high frequency (UHF) antenna test pattern opening with an approximate size of 5 by 5 inches. The ink based composition was pressed through the openings and onto 2 mil silicon treated polyethylene terephthalate (PET) films using a 70 Durometer squeegee blade. The ink based composition was then dried in an oven for 3 minutes at 266° F. (130° C.). The dried film thickness of the composition was between 6 and 8 microns, as determined by a Surfcom 130A Surface Profilometer. Resistance was measured by placing two Fluke 189 Multimeter probes across the UHF ring loop. The measuring points were marked for later reference.

Next, a dielectric layer was applied over the UHF antenna patterns in both a single and double layer configuration. The dielectric layer was applied with a 200 stainless steel mesh screen having a thread diameter of 41 microns, an EOM of 5 microns, and a 5.5 by 5.5 inch square cut out pattern. The dielectric layer was allowed to rest for 30 seconds before being heated in an oven at 120° C. (248° F.) for 30 seconds. Some of the samples with the single dielectric layer were put aside, while the remaining samples were over-coated with a second dielectric layer utilizing the same application process and cure profile. The dried film thickness of the single dielectric layer was between 13 and 15 microns, and the dried film thickness of the double dielectric layer was between 29 and 33 microns, as determined by a Mitutoyo micrometer.

After applying the dielectric layer, an adhesive composition was applied over the single and double dielectric layers with the use of a 165 stainless steel mesh screen having a thread diameter of 51 microns, an EOM of 5 microns and a test pattern opening of 6 by 6 inches. The adhesive composition was pressed through the stainless steel mesh with a 70 Durometer squeegee blade. The adhesive layer was left to rest for 30 seconds and then dried in an oven for 15 seconds at 120° C. (248° F.). The dried film thickness of the adhesive layer was between 30 and 35 microns, as determined by a Mitutoyo micrometer.

The PET films with the silver based UHF antenna pattern, single or double dielectric layer, and adhesive layer were cut into strips and applied to a 2.8 mm acrylic substrate using a 80 Durometer rubber wheel hot stamping press with a roller temperature of 195° C. (383° F.) and a contact time of 2 seconds at a pressure of 60 psi. The PET film was then removed from the substrate. The resistance of the antennas transferred onto the acrylic substrates were measured by placing two Fluke 189 Multimeter probes across the UHF ring loop on the previously marked points. The resistance of two sample strips having a single dielectric layer, before and after heat stamping to a 2.8 mm acrylic substrate, are listed in Table 8. In addition, the resistance of two sample strips having a double dielectric layer, before and after heat stamping to a 2.8 mm acrylic substrate, are listed in Table 9.

TABLE 8

| Resistance (ohms (Ω)) | Sample 15 | Sample 16 |
|---|---|---|
| Initial Resistance of dried silver antenna loop | 1.68 | 1.71 |
| Resistance after heat stamping @ 383° F. | 1.44 | 1.43 |
| Change in Resistance | −0.24 | −0.28 |
| Percent Decrease in Resistance (%) | 14.3% | 16.4% |
| Average Change in Resistance | −0.26 | |
| Average Percent Decrease in Resistance (%) | 15.4% | |

TABLE 9

| Resistance (ohms (Ω)) | Sample 17 | Sample 18 |
|---|---|---|
| Initial Resistance of dried silver antenna loop | 1.64 | 1.75 |
| Resistance after heat stamping @ 383° F. | 1.20 | 1.20 |
| Change in Resistance | −0.44 | −0.55 |
| Percent Decrease in Resistance (%) | 26.8% | 31.4% |
| Average Change in Resistance | −0.495 | |
| Average Percent Decrease in Resistance (%) | 29.1% | |

As shown in Tables 8 and 9, the resistance of the silver based composition decreased in all samples after applying heat and pressure for 2 seconds. Accordingly, the conductivity of the silver based composition improved after applying heat and pressure according to the present methods.

Example 5

A silver based composition comprising silver flakes dispersed in a styrene butadiene binder was spread over a 230 mesh screen coated with a Capillex CX emulsion and having a six up ultra-high frequency (UHF) antenna test pattern opening with an approximate size of 5 by 5 inches. The ink based composition was pressed through the openings and onto 2 mil silicon treated polyethylene terephthalate (PET) films using a 70 Durometer squeegee blade. The ink based composition was then dried in an oven for 3 minutes at 266° F. (130° C.). The dried film thickness of the composition was between 6 and 8 microns, as determined by a Surfcom 130A Surface Profilometer. Resistance was measured by placing two Fluke 189 Multimeter probes across the UHF ring loop. The measuring points were marked for later reference.

Next, a dielectric layer was applied over the UHF antenna patterns in a double layer configuration. The dielectric layer was applied with a 200 stainless steel mesh screen having a thread diameter of 41 microns, an EOM of 5 microns, and a 5.5 by 5.5 inch square cut out pattern. The dielectric layer was allowed to rest for 30 seconds before being heated in an oven at 120° C. (248° F.) for 30 seconds. The samples were then over-coated with a second dielectric layer utilizing the same application process and cure profile. The dried film thickness of the double dielectric layer was between 29 and 33 microns, as determined by a Mitutoyo micrometer.

A super opaque graphic layer was then applied over the double dielectric layer pattern using a 325 stainless steel mesh having a 23 micron diameter and an EOM of 5 microns. The graphic layer was allowed to rest for 30 seconds before being heated in an oven at 120° C. (248° F.) for 30 seconds.

After applying the graphic layer, an adhesive composition was applied over the graphic layer with the use of a 165 stainless steel mesh screen having a thread diameter of 51 microns, an EOM of 5 microns, and a test pattern opening of 6 by 6 inches. The adhesive composition was pressed through the stainless steel mesh with a 70 Durometer squeegee blade. The adhesive layer was left to rest for 30 seconds and then dried in an oven for 15 seconds at 120° C. (248° F.). The dried film thickness of the adhesive layer was between 30 and 35 microns, as determined by a Mitutoyo micrometer.

The PET films with the silver based UHF antenna pattern, double dielectric layer, graphic layer, and adhesive layer were cut into strips and applied to a 2.8 mm acrylic substrate using a 80 Durometer rubber wheel hot stamping press with a roller temperature of 195° C. (383° F.) and a contact time of 2 seconds at a pressure of 60 psi. The PET film was then removed from the substrate. The resistance of the antennas transferred onto the acrylic substrates were measured by placing two Fluke 189 Multimeter probes across the UHF ring loop on the previously marked points. The resistance of two sample strips, before and after heat stamping to a 2.8 mm acrylic substrate, are listed in Table 10.

TABLE 10

| Resistance (ohms (Ω)) | Sample 19 | Sample 20 |
|---|---|---|
| Initial Resistance of dried silver antenna loop | 1.65 | 1.70 |
| Resistance after heat stamping @ 383° F. | 1.23 | 1.26 |
| Change in Resistance | −0.42 | −0.44 |
| Percent Decrease in Resistance (%) | 25.5% | 25.9% |
| Average Change in Resistance | −0.435 | |
| Average Percent Decrease in Resistance (%) | 25.7% | |

As shown in Tables 10, the resistance of the silver based composition decreased in both samples after applying heat and pressure for 2 seconds. Accordingly, the conductivity of the silver based composition improved after applying heat and pressure according to the present methods.

Whereas particular features of this invention have been described above for purposes of illustration, it will be evident to those skilled in the art that numerous variations of the details of the present invention may be made without departing from the invention as defined in the appended claims.

The invention claimed is:
1. A method of transferring an electrically conductive material to a substrate, the method comprising:
   a) contacting at least a portion of a non-planar substrate with a layered structure comprising:

(1) a dielectric material layer positioned over a carrier film;
(2) an electrically conductive material layer comprising the electrically conductive material positioned over the dielectric material layer; and
(3) an adhesive layer positioned over the electrically conductive material layer; and
b) applying heat and pressure to the substrate and carrier film for a period of time ranging from 1 to 40 seconds, at a temperature ranging from 200° F. to 450° F., and at a pressure ranging from 30 to 150 psi, such that the electrically conductive material layer adheres to the substrate.

2. The method of claim 1, further comprising c) removing the carrier film from the substrate after step b).

3. The method of claim 1, wherein the electrically conductive material is applied in a pattern over at least a portion of the carrier film to form the electrically conductive material layer.

4. The method of claim 1, wherein the layered structure further comprises a release coat layer positioned under the dielectric material layer.

5. The method of claim 1, wherein a release coat layer is positioned over at least a portion of the carrier film, and the dielectric material layer is positioned over at least a portion of the release coat layer.

6. The method of claim 1, wherein the electrically conductive material is applied over the carrier film after application of a dielectric material of the dielectric material layer and a material of a release coat layer, and the electrically conductive material is applied in a pattern on top of at least a portion of the dielectric material layer.

7. The method of claim 1, wherein the layered structure further comprises a second electrically conductive material layer positioned under the dielectric material layer.

8. The method of claim 1, wherein the layered structure further comprises a release coat layer, and wherein a decorative material is applied over at least a portion of one or more of the electrically conductive material layer, the release coat layer, the adhesive layer, the dielectric material layer, and the carrier film.

9. The method of claim 1, wherein the layered structure further comprises a release coat layer and one or more of the release coat layer, the dielectric material layer, the electrically conductive material layer, and the adhesive layer is completely free of halogenated organic compounds.

10. The method of claim 1, wherein the electrically conductive material layer comprises electrically conductive particles comprising nickel, iron, copper, zinc, chromium, cobalt, aluminum, silver, gold, iridium, platinum, palladium, zirconium, tin, carbon, or mixtures thereof.

11. The method of claim 10, wherein the electrically conductive material layer further comprises a binder.

12. The method of claim 11, wherein the binder is thermoplastic.

13. The method of claim 1, wherein the electrically conductive material layer is completely free of silver-silver chloride.

14. The method of claim 1, wherein the electrically conductive material layer forms an antenna on the substrate.

15. The method of claim 1, wherein the substrate has a glass transition temperature of less than 150° C.

16. The method of claim 1, wherein the electrically conductive material layer adhered to the substrate has a resistivity of less than 20 milliohms per square per mil, as determined by the resistivity measurement.

17. The method of claim 1, wherein conductivity of the electrically conductive material layer increases after applying heat and pressure.

18. The method of claim 1, wherein heat and pressure are applied to the substrate and carrier film for a period of time ranging from 1 to 20 seconds, at a temperature ranging from 300° F. to 450° F., and at a pressure ranging from 40 to 120 psi, such that the electrically conductive material adheres to the substrate.

19. A method of forming a layered structure for a heat stamping application comprising:
a) applying a material to form a release coat layer over at least a portion of a carrier film;
b) applying a dielectric material over the release coat layer to form a dielectric material layer;
c) drying the dielectric material layer for a period of time ranging from 1 to 120 seconds;
d) applying an electrically conductive material in a pattern over the dielectric material layer to form an electrically conductive material layer;
e) drying the electrically conductive material layer for a period of time ranging from 1 to 180 seconds;
f) applying an adhesive over at least a portion of the electrically conductive material layer to form an adhesive layer; and
g) drying the adhesive layer for a period of time ranging from 1 to 120 seconds,
wherein the layered structure is positioned over a non-planar substrate.

20. The method of claim 19, further comprising applying a decorative material over at least a portion of one or more of the carrier film, release coat layer, dielectric material layer and electrically conductive material layer, and drying the decorative material for a period of time ranging from 1 to 120 seconds.

21. The method of claim 19, wherein the layered structure is rolled after step g).

22. A method of transferring an electrically conductive material to a substrate, the method comprising:
a) forming a layered structure from a method comprising:
i) applying a material over at least a portion of a carrier film to form a release coat layer;
ii) applying a dielectric material over the release coat layer to form a dielectric material layer;
iii) drying the dielectric material layer;
iv) applying an electrically conductive material in a pattern over at least a portion of the dielectric material layer to form an electrically conductive material layer;
v) drying the electrically conductive material layer;
vi) applying an adhesive over at least a portion of the electrically conductive material layer to form an adhesive layer; and
vii) drying the adhesive layer;
b) contacting at least a portion of a non-planar substrate with the layered structure; and
c) applying heat and pressure to the substrate and layered structure for a period of time ranging from 1 to 40 seconds, at a temperature ranging from 200° F. to 450° F., and at a pressure ranging from 30 to 150 psi, such that the electrically conductive material layer adheres to the substrate,
wherein conductivity of the electrically conductive material layer increases after applying heat and pressure.

23. The method of claim 22, further comprising d) removing the carrier film from the substrate after step c).

24. The method of claim 22, wherein the electrically conductive material layer adhered to the substrate has a resistivity of less than 20 milliohms per square per mil, as determined by the resistivity measurement.

\* \* \* \* \*